United States Patent [19]

Sasada et al.

[11] Patent Number: 4,794,276

[45] Date of Patent: Dec. 27, 1988

[54] LATCH CIRCUIT TOLERANT OF UNDEFINED CONTROL SIGNALS

[75] Inventors: Tatsuyoshi Sasada; Takenori Okitaka, both of Hyogo, Japan

[73] Assignee: Mitsubishi Denki Kabushiki Kaisha, Tokyo, Japan

[21] Appl. No.: 921,180

[22] Filed: Oct. 21, 1986

[30] Foreign Application Priority Data

Oct. 21, 1985 [JP] Japan ................................ 60-235715

[51] Int. Cl.$^4$ ...................... H03K 3/013; H03K 3/356; H03K 17/687; H03K 19/096
[52] U.S. Cl. .................................. 307/279; 307/272.2; 307/585; 377/79
[58] Field of Search .................... 307/272 A, 279, 451, 307/452, 453, 480, 481, 585; 377/115, 116, 117, 79

[56] References Cited

U.S. PATENT DOCUMENTS

| | | | |
|---|---|---|---|
| 3,720,848 | 3/1973 | Schmidt | 307/579 |
| 4,250,406 | 2/1981 | Alaspa | 377/79 |
| 4,399,372 | 8/1983 | Tanimoto et al. | 307/279 |
| 4,484,087 | 11/1984 | Mazin et al. | 307/279 |
| 4,554,467 | 11/1985 | Vaughn | 307/279 |
| 4,613,773 | 9/1986 | Koike | 307/279 |
| 4,703,200 | 10/1987 | Zangara | 377/79 |
| 4,709,173 | 11/1987 | Nishimichi et al. | 307/279 |

FOREIGN PATENT DOCUMENTS 3443798  6/1986  Fed. Rep. of Germany ...... 307/279

Primary Examiner—Stanley D. Miller
Assistant Examiner—Tai Van Duong
Attorney, Agent, or Firm—Sughrue, Mion, Zinn, Macpeak, and Seas

[57] ABSTRACT

A master slave latch circuit wherein the output impedances of the input and latching gates in both the master and slave sections are adjusted to prevent the two input gates from turning on simultaneously.

3 Claims, 7 Drawing Sheets

| $\phi$ | $O_1$ | $O_2$ | B | $O_3$ | $O_4$ | C |
|---|---|---|---|---|---|---|
| 0 | S | M | $O_2$ (LATCHED) | M | S | B → $O_3$ |
| $\phi_1$ | S | M | $O_2$ (LATCHED) | EQUAL | EQUAL | ↑ |
| $\phi_0$ | S | M | $O_2$ (LATCHED) | S | M | $O_4$ LATCHED |
| $\phi_2$ | EQUAL | EQUAL | ↑ | S | M | $O_4$ (LATCHED) |
| Vcc | M | S | A → $O_1$ | S | M | $O_4$ (LATCHED) |

$0 < \phi_1 < \phi_0 < \phi_2 < Vcc$

| $\phi$ | $O_1$ | $O_2$ | B | $O_3$ | $O_4$ | C |
|---|---|---|---|---|---|---|
| 0 | S | M | $O_2$ (LATCHED) | M | S | B → $O_3$ |
| $\phi_1$ | S | M | $O_2$ (LATCHED) | EQUAL | EQUAL | ↕ |
| $\phi_0$ | S | M | $O_2$ (LATCHED) | S | M | $O_4$ LATCHED |
| $\phi_2$ | EQUAL | EQUAL | ↕ | S | M | $O_4$ (LATCHED) |
| Vcc | M | S | A → $O_1$ | S | M | $O_4$ (LATCHED) |

$0 < \phi_1 < \phi_0 < \phi_2 < Vcc$

FIG. 3(a)

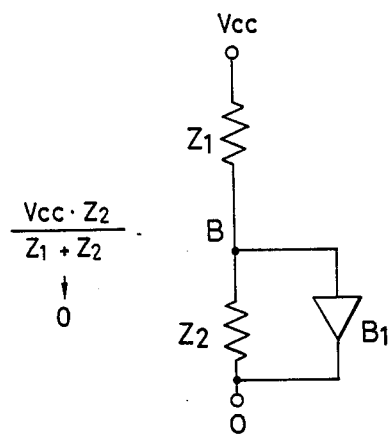

$$\frac{V_{cc} \cdot Z_2}{Z_1 + Z_2} \rightarrow 0$$

$\phi = \bar{\phi} = \phi_0 \qquad Z_1 > Z_2$ $O_1 = V_{cc} \qquad O_2 = 0$

FIG. 3(b)

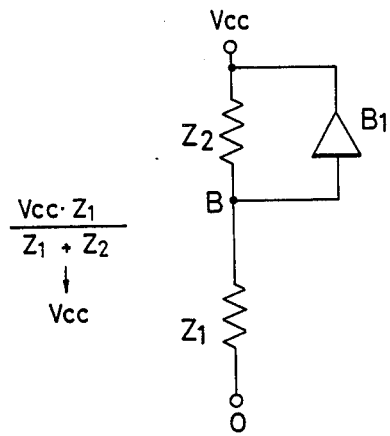

$$\frac{V_{cc} \cdot Z_1}{Z_1 + Z_2} \rightarrow V_{cc}$$

$\phi = \bar{\phi} = \phi_0 \qquad Z_1 > Z_2$ $O_1 = 0 \qquad O_2 = V_{cc}$

FIG. 3(c)

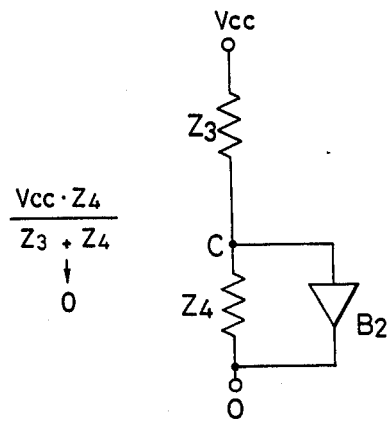

$$\frac{V_{cc} \cdot Z_4}{Z_3 + Z_4} \rightarrow 0$$

$\phi = \bar{\phi} = \phi_0 \qquad Z_3 > Z_4$ $O_3 = V_{cc} \qquad O_4 = 0$

FIG. 3(d)

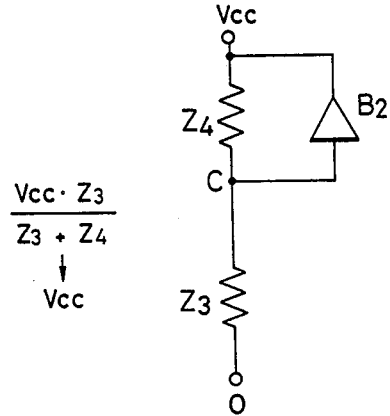

$$\frac{V_{cc} \cdot Z_3}{Z_3 + Z_4} \rightarrow V_{cc}$$

$\phi = \bar{\phi} = \phi_0 \qquad Z_3 > Z_4$ $O_3 = 0 \qquad O_4 = V_{cc}$

| φ | $O_5$ | $O_6$ | B | $O_7$ | $O_8$ | C |
|---|---|---|---|---|---|---|
| 0 | S | M | $O_6$ (LATCHED) | M | S | B → $O_7$ |
| $φ_3$ | EQUAL | EQUAL | ↕ | M | S | B → $O_7$ |
| $φ_0$ | M | S | A → $O_5$ | M | S | B → $O_7$ |
| $φ_4$ | M | S | A → $O_5$ | EQUAL | EQUAL | ↕ |
| Vcc | M | S | A → $O_5$ | S | M | $O_8$ (LATCHED) |

$0 < φ_3 < φ_0 < φ_4 < V_{cc}$
M : MASTER   S : SLAVE

LATCH CIRCUIT TOLERANT OF UNDEFINED CONTROL SIGNALS

BACKGROUND OF THE INVENTION

1. Field of the Invention

This invention relates to a latch circuit used for a semiconductor integrated circuit device or the like.

2. Background Art

FIG. 12 shows a general master/slave latch circuit. In FIG. 12 is shown an input A to a master latch circuit M. An input B to a slave latch circuit S is the output of the master latch circuit M. Also shown are an output C of the slave latch circuit S and a control signal $\phi$. A master input gate $G_5$ and a slave latching gate $G_8$ have enable state and disable states controlled by a control signal $\phi$ and have respective outputs $O_5$ and $O_8$. A master latching gate $G_6$ and a slave input gate $G_7$ have their enable states and disable states controlled by a control signal $-\phi$ and have respective outputs $O_6$ and $O_7$. The control signal $-\phi$ is the complement of the control signal $\phi$. The master latch circuit M contains a buffer $B_3$ and the slave latch circuit S contains a buffer $B_4$.

FIG. 13 is a table indicating the states of the gates $G_5$ through $G_8$ and of the latch circuit outputs B and C with the states of the control signal $\phi$.

The operation of the conventional master/slave latch circuit will be described.

When the master input gate $G_5$ and the slave latching gate $G_8$ are enabled by the control signal $\phi$, the gates $G_6$ and $G_7$ are disabled. As a result, the signal of the input A is applied to the output $O_5$ of the gate $G_5$. Simultaneously, in the slave latch circuit S the signal of the output C existing before the change of the control signal $\phi$ is latched by the gate $G_8$ and the buffer $B_4$. When the control signal $\phi$ is inverted, the gates $G_5$ and $G_8$ are disabled while the gates $G_6$ and $G_7$ are placed in an enabled state. Under this condition, in the master latch circuit M, the signal of the output B existing before the control signal $\phi$ is inverted is latched by the gate $G_6$ and the buffer $B_3$. At the same time, the signal of the output B latched by the master latch circuit M is transmitted through the gate $G_7$ in the slave latch circuit S and thus transmitted to the output C.

The conventional master/slave latch circuit suffers from a difficulty that, when the potential of the control signal $\phi$ becomes unstable between the "H (high)" potential and the "L (low)" potential (for instance the potential of the control signal $\phi$ changes slowly from "L" to "H"), the signal of the input A read into the master latch circuit M is directly transmitted to the output C of the slave latch circuit S. The signal provided at the output B (described later) is determined by which one of the outputs of the master input gate $G_5$ and the slave latching gate $G_8$ has the smaller output impedance. Similarly, the signal provided at the output C is determined by which one of the outputs of the master latching gate $G_6$ and the slave input gate $G_7$ has the smaller output impedance. These output impedances are determined depending upon performances of transistors used therein.

On the other hand, in the conventional master/slave latch circuit, in order to decrease the delay time of signal transmission from the input A to the output B and from the input B to the output C, the input gate $G_5$ in the master latch circuit and the input gate $G_7$ in the slave latch circuit are made large in transistor size. Also, in order to reduce the chip size of the semiconductor integrated circuit device or the like the master latching gate $G_6$ and the slave latching gate $G_8$ are made small in transistor size. Accordingly, in the above-described case, when the potential of the control signal $\phi$ is $\phi_3$ ($O < \phi_3 < \phi_O$), the output impedance $Z_5$ equal to the output impedance $Z_6$ of the master latching gate $G_6$. Furthermore, when the potential of the control signal $\phi$ is $\phi_4$ ($\phi_O < \phi_4 < V_{cc}$), the output impedence $Z_7$ F of the slave input gate $G_7$ becomes equal to the output impedance $Z_8$ of the slave latching gate $G_8$. Therefore, when $\phi_3 < \phi < \phi_4$, the output impedance $Z_5$ of the master input gate $G_5$ is lower than the output impedance $Z_6$ of the master latching gate $G_6$, and the output impedance $Z_7$ of the slave input gate $G_7$ is lower than the output impedance $Z_8$ of the slave latching gate $G_8$. As a result of this, at the output B the output $O_5$ of the master input gate $G_5$ is provided as a "master" output while the output $O_6$ of the master latching gate $G_6$ is provided as a "slave" output. Also, at the output C the output $O_7$ of the gate slave input $G_7$ is provided as a "master" output while the output $O_8$ of the slave latching gate $G_8$ is provided as a "slave" output. That is, both of the outputs $O_5$ and $O_7$ from the input gates $G_5$ and $G_7$ are provided as "master" outputs, and the signal of the input A read into the master latch circuit M is transmitted directly to the slave latch circuit output C with the result that the function of the master/slave latch circuit is not correctly performed. That is, the master/slave latch circuit operates erroneously.

SUMMARY OF THE INVENTION

Accordingly, an object of this invention is to eliminate the above-described difficulties accompanying a conventional master/slave latch circuit.

More specifically, an object of the invention is to provide a master/slave latch circuit in which its original master/slave latch function is correctly performed and the erroneous operation is prevented.

A master/slave latch circuit according to the invention is so designed that, irrespective of the magnitude of voltage of a gate control signal, the output of a reading gate in the master latch circuit and the output of a reading gate in the slave latch circuit are not provided as "master" outputs simultaneously.

In the master/slave latch of the invention, there is provided a means for preventing, irrespective of the value of voltage of the gate control signal, the simultaneous output of the input gate in the master latch circuit and the output of the input gate in the slave latch circuit. Thus, the outputting of the input signal of the master latch circuit directly from the slave latch circuit is prevented.

BRIEF DESCRIPTION OF THE DRAWINGS

FIG. 3 is a diagram showing equivalent circuits of the master latch circuit and the slave latch circuit with $\phi = -\phi = \phi_O$.

In these figures, like parts are designated by like reference numerals or characters.

DETAILED DESCRIPTION OF THE PREFERRED EMBODIMENTS

Figures 12, 13:
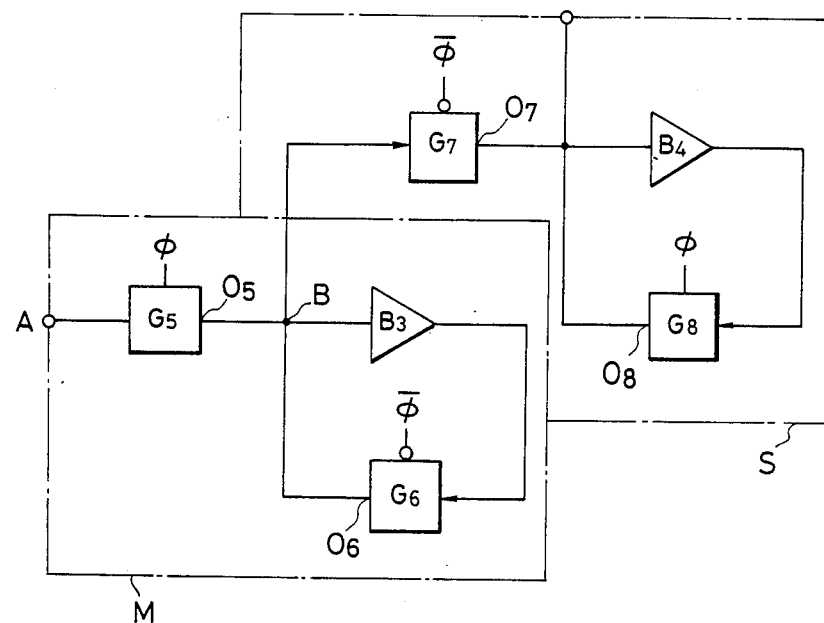
FIG. 12 is a circuit diagram showing a conventional ordinary master/slave latch circuit.
FIG. 13 is a diagram indicating the states of various gates with the states of a control signal $\phi$.

A first embodiment of this invention will be described with reference to FIG. 1. The outward form of this circuit is the same as that of FIG. 12, although the elements have been renumbered. Most importantly, the output impedances of the gates are restricted.

Moreover, the associated logic table is different. FIG. 2 indicates the states of outputs $O_1$ through $O_4$ of gates $G_1$ through $G_4$ and the latch circuit outputs B and C as a function of the voltages of the control signal $\phi$. FIG. 3 shows equivalent circuits of the master and the slave latch circuits in the case when $\phi = -\phi = \phi_O$, showing the variation in potential of the output B. In FIG. 3, reference characters $Z_1$ through $Z_4$ designate respectively the output impedances of the master input gate $G_1$, the master latching gate $G_2$, the slave input gate $G_3$ and the slave latching gate $G_4$. It is required that $Z_1$ is equal to or greater than $Z_2$ and $Z_3$ is greater than $Z_4$ and these output impedances are selected from the range of 100 ohms to 1,000 ohms so as to meet the characteristics of transistors used therein. $B_1$ and $B_2$ respectively represent the buffers in the master latch circuit and the slave latch circuit.

The enabled and disabled states of the gates $G_1$ and $G_4$ are controlled by the control signal $\phi$ while the enabled and disabled states of the gates $G_2$ and $G_3$ are controlled by the complemented control signal $-\phi$. When the gates $G_1$ and $G_4$ are in the enabled state and the gate $G_2$ and $G_3$ are in the disabled state, in the master latch circuit the signal of the input A is transmitted to the output $O_1$ of the master input gate $G_1$ while in the slave latch circuit the signal of the output C provided before the change of the control signal $\phi$ is latched by the slave latching gate $G_4$ and the buffer $B_2$. Upon the inversion of the control signal $\phi$, the gates $G_1$ and $G_4$ are disabled while the gates $G_2$ and $G_3$ are enabled. In this operation, in the master latch circuit, the signal of the output B provided before inversion of the control signal $\phi$ is latched by the master latching gate $G_2$ and the buffer $B_1$, while in the slave latch circuit the signal of the output B thus latched is read by the slave input gate $G_3$ and transmitted to the output C.

In the above-described embodiment, as shown in FIG. 3, when $\phi = -\phi = \phi_O$, in the master latch circuit, the output impedance $Z_2$ of the latching gate $G_2$ is less than the output impedance $Z_1$ of the input gate $G_1$. Therefore, at the master output B, the potential of the output $O_2$ of the master latching gate $G_2$ is provided as a "master" potential while the potential of the output $O_1$ of the master input gate $G_1$ is provided as a "slave" potential (cf. the parts (a) and (b) of FIG. 3). In the slave latch circuit, the output impedance $Z_4$ of the latching gate $G_4$ is less than the output impedance $Z_3$ of the input gate $G_3$. Therefore, at the slave output C, the potential of the output $O_4$ of the slave latching gate $G_4$ is provided as a "master" potential while the potential of the output $O_3$ of the slave input gate $G_3$ is provided as a "slave" potential (cf. parts (c) and (d) of FIG. 3).

Figures 1, 2:
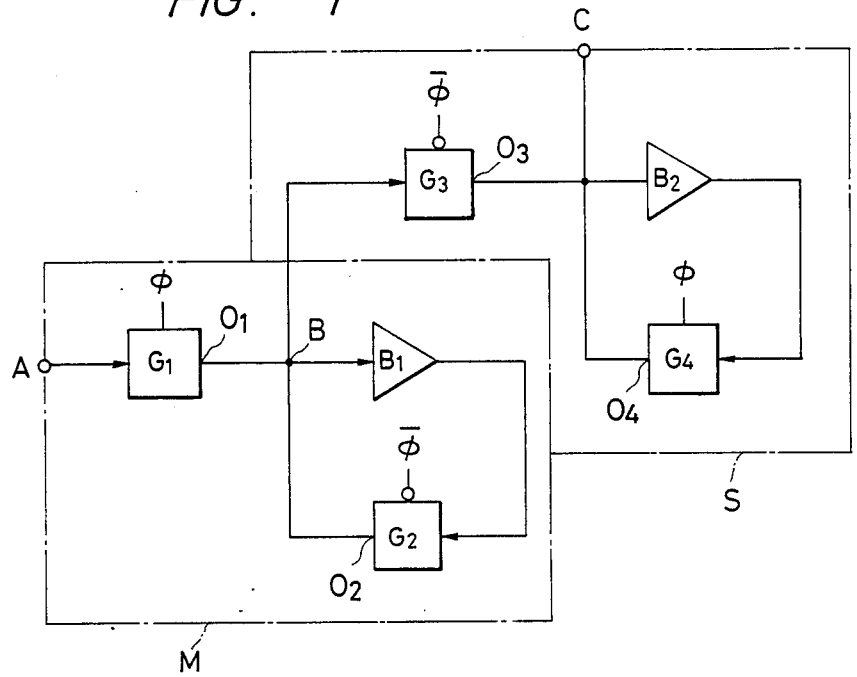
FIG. 1 is a circuit diagram showing a master/slave latch circuit which is a first embodiment of this invention.
FIG. 2 is a diagram indicating the states of various gates with the states of a control signal $\phi$.

Accordingly, in the above-described embodiment, as shown in FIG. 2, when the potential of the control signal $\phi$ is $\phi_1$ ($0 < \phi_1 < \phi_O$), the output impedance $Z_3$ of the slave input gate $G_3$ becomes equal to the output impedance $Z_4$ of the slave latching gate $G_4$. Also, when the potential of the control signal $\phi$ is $\phi_2$ ($\phi_O < \phi_2 < V_{cc}$), the output impedance $Z_1$ of the master input gate $G_1$ becomes equal to the output impedance $Z_2$ of the master input gate $G_2$. Therefore, at the output B, when $0 \leq \phi < \phi_2$, the output $O_2$ of the master latching gate $G_2$ is provided as a "master" output while the output $O_1$ of the gate $G_1$ is provided as a "slave" output. Also, when $\phi_2 < \phi \leq V_{cc}$, the output $O_1$ of the master input gate $G_1$ is provided as a "master" output while the output $O_2$ of the master latching gate $G_2$ is provided as a "slave" output. And at the output C, when $0 \leq \phi < \phi_1$, the output $O_3$ of the slave input gate $G_3$ is provided as a "master" output while the output $O_4$ of the slave latching gate $G_4$ is provided as a "slave" output. Also, when $\phi_1 < \phi \leq V_{cc}$ the output $O_4$ of the slave latching gate $G_4$ is provided as a "master" output while the output $O_3$ of the slave input gate $G_3$ is provided as a "slave" output. Therefore, there is no case in which both of the outputs $O_1$ and $O_3$ are provided as "master" outputs. That is, the difficulty that the signal of the input A read by the master latch circuit is transmitted directly to the slave latch circuit output C will never occur. Thus, the above described master/slave latch circuit will never operate erroneously.

Figure 4:
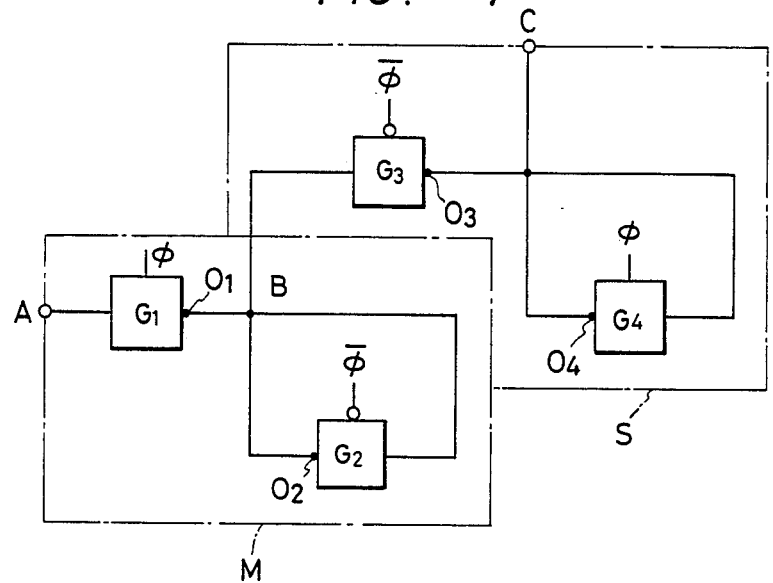
FIGS. 4, 5, 7, 8, 10 and 11 are circuit diagrams showing master/slave latch circuits which are other embodiments of the invention.

In the above-described embodiment, the buffers $B_1$ and $B_2$ are employed. However, in the case where the output of the gates $G_1$ through $G_4$ are sufficiently large, a circuit as shown in FIG. 4 in which the buffers $B_1$ and $B_2$ are not employed may be used with the same effect as the above-described embodiment.

Figure 5:
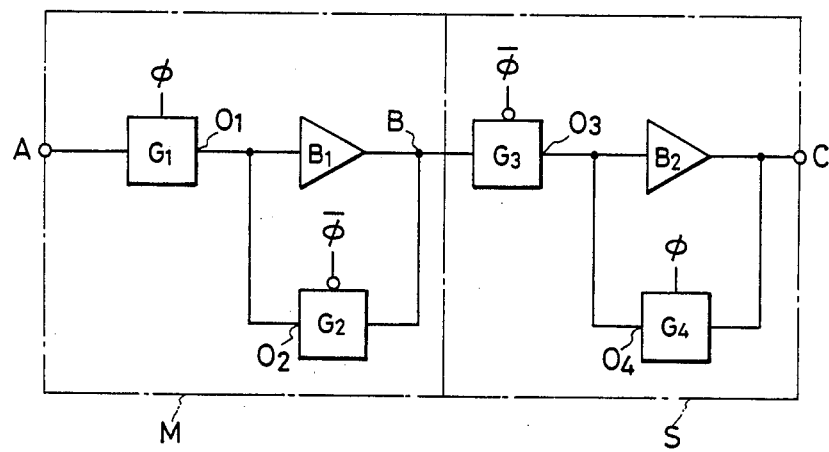

In the above-described first embodiment, the output B of the master latch circuit is the connecting point of the output $O_1$ of the master input gate $G_1$ and the output $O_2$ of the master latching gate $G_2$. Also, the output C of the slave latch circuit S is the connecting point of the output $O_3$ of the slave input gate $G_3$ and the output $O_4$ of the slave latching gate $G_4$. However, the circuit may be so modified that, as shown in FIG. 5, the input of the master latching gate $G_2$ is the output B of the master latch circuit M, and the input of the slave latching gate $G_4$ is the output C of the slave latch circuit S.

Figure 6A:
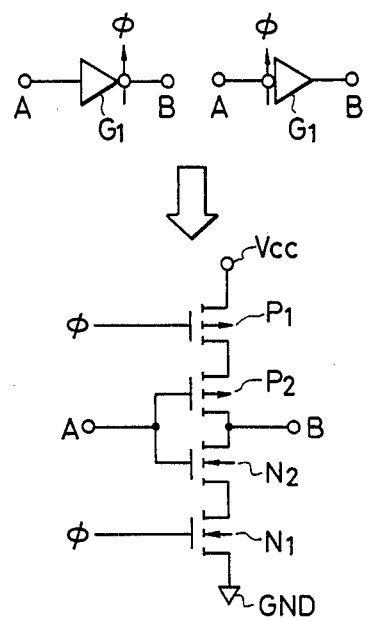
FIG. 6 is a diagram showing examples of clocked gates employed in the circuits of FIGS. 7 and 8.
Figure 6B:
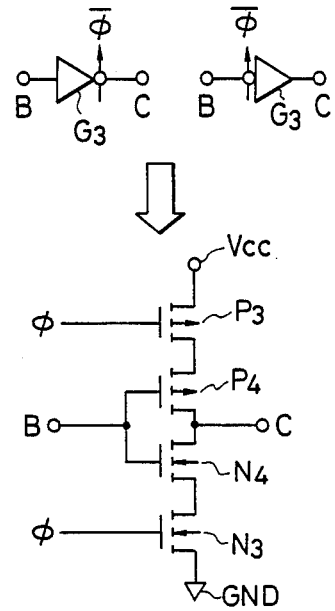
Figure 7:
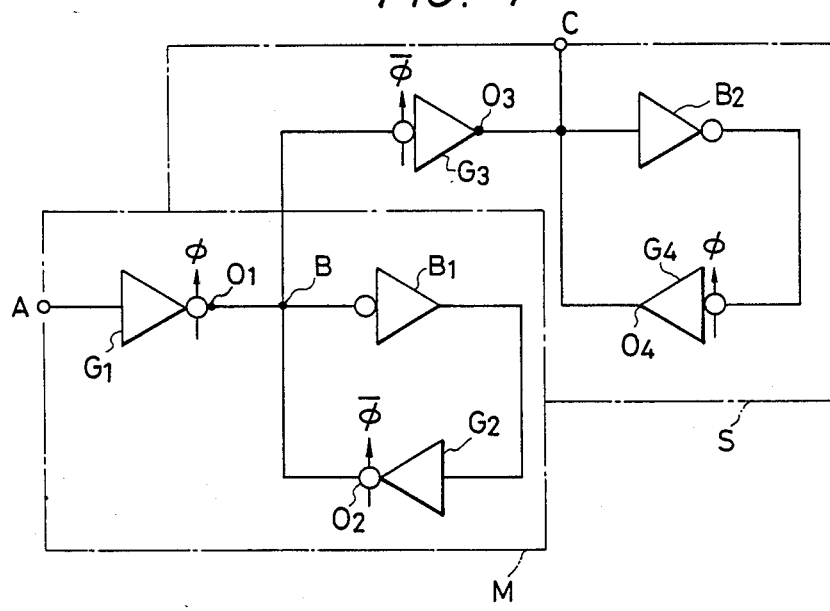
Figure 8:
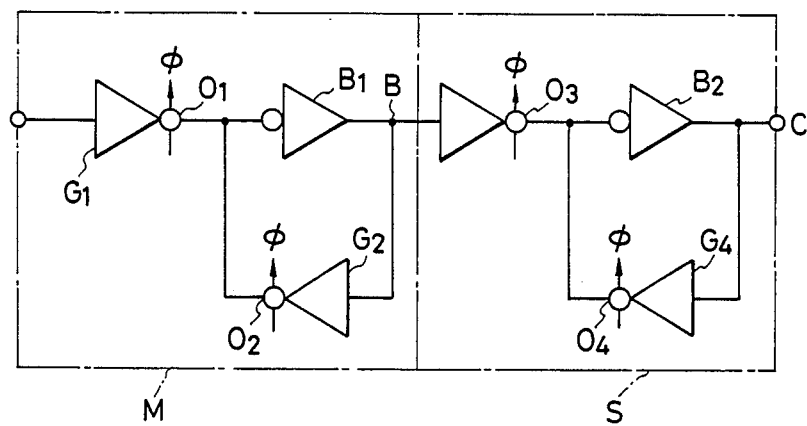

The first embodiment has been described with reference to the ordinary master/slave latch circuit. However, it may be modified as follows. The gates are replaced by clocked gates as shown in FIGS. 6(a) and 6(b) to form a circuit as shown in FIGS. 7 or 8, and the output impedance $Z_1$ through $Z_4$ of the clocked gates $G_1$ through $G_4$ are determined similarly as in the case of the above-described embodiment. The modification can provide the same effect as the above-described embodiment.

Figure 9A:
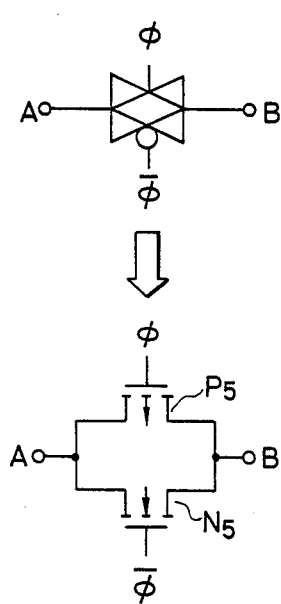
FIG. 9 is a diagram showing examples of transmission gates used in the circuits of FIGS. 10 and 11.
Figure 9B:
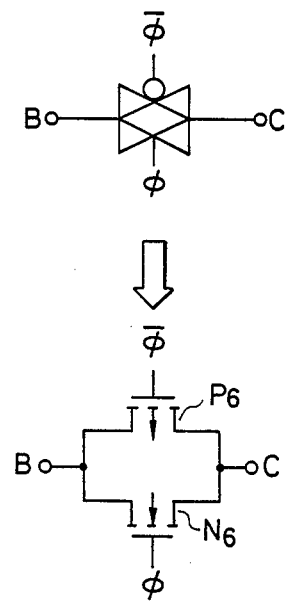
Figure 10:
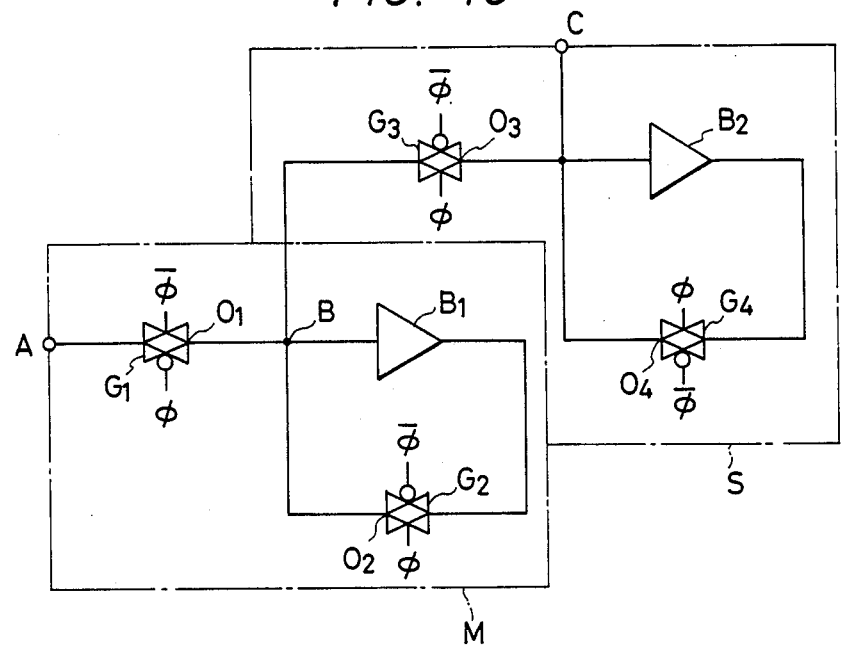
Figure 11:
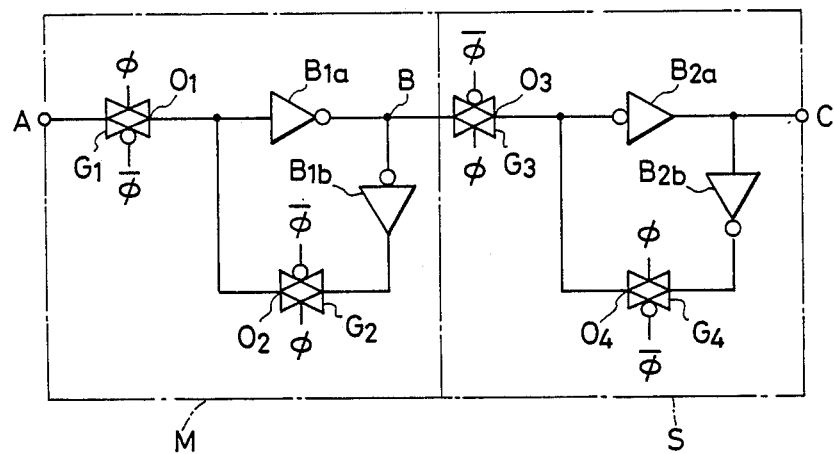

Furthermore, transmission gates as shown in the FIGS. 9(a) and 9(b) may be employed to form a circuit as shown in FIGS. 10 or 11, and the output impedance $Z_1$ through $Z_4$ of the transmission gates $G_1$ through $G_4$ are determined similarly as in the case of the above-described embodiment. This modification also can provide the same effect as the above-described embodiment.

In FIGS. 6 and 9, reference characters $P_1$ through $P_6$ designate P-channel MOS transistors, and $N_1$ through $N_6$ N-channel MOS transistors.

As is apparent from the above description, the master/slave latch circuit according to the invention is so designed that, when the voltage of the control signal $\phi$ or $-\phi$ changes slowly in the range of 0 V to $V_{cc}$, the output of the reading gate in the master latch circuit and the output of the reading gate in the slave latch circuit may not be provided as "master" outputs simultaneously. Therefore, the master/slave latch circuit of the invention is free from the erroneous operation that the signal of the input A is transmitted through the output B of the master latch circuit directly to the slave latch circuit output C.

We claim:

1. A master/slave latch circuit, comprising:

a master latch circuit comprising a first reading gate and a first latching gate, said first reading gate receiving an input signal on an input thereof and having an output connected to a common connection point of said master latch circuit, said first latching gate having an output connected to said common connecting point of said master latch circuit, a control signal and an inverted control signal being applied to control inputs of said first reading gate and said first latching gate, respectively, and said first reading gate having an output impedance equal to or larger than an output impedance of said first latching gate; and a slave latch circuit comprising a second reading gate and a second latching gate, an input of said second reading gate being connected to said common connection point of said master latch circuit and an output of said second reading gate being connected to a common connection point of said slave latch circuit, said second latching gate having an output connected to said common connecting point of said slave latch circuit, said inverted control signal and said control signal being applied to control inputs of said second reading gate and said second latching gate, respectively, and said second reading gate having an output impedance greater than an output impedance of said second latching gate.

2. A latch circuit as recited in claim 1, wherein said first and second reading and latching gates are all clocked gates.

3. A latch circuit as recited in claim 1, wherein said first and second reading and latching gates are all transmission gates.

* * * * *